United States Patent
Magrath

(10) Patent No.: US 8,139,792 B2
(45) Date of Patent: Mar. 20, 2012

(54) AMPLIFIER CIRCUITS, METHODS OF STARTING AND STOPPING AMPLIFIER CIRCUITS

(75) Inventor: Anthony James Magrath, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 1284 days.

(21) Appl. No.: 11/826,369

(22) Filed: Jul. 13, 2007

(65) Prior Publication Data

US 2008/0024213 A1 Jan. 31, 2008

(30) Foreign Application Priority Data

Jul. 14, 2006 (GB) ................... 0614026.3

(51) Int. Cl.
*H03F 99/00* (2009.01)
(52) U.S. Cl. ......... 381/120; 381/94.1; 330/10; 330/251; 330/252; 330/207 A; 330/257; 330/259; 330/260; 330/261; 330/271; 330/273; 330/279; 330/297; 330/199; 330/200; 330/278
(58) Field of Classification Search .................. 381/120, 381/94.1; 330/10, 251, 207 A, 257, 259, 330/260, 261, 271, 273, 279, 297, 199, 200, 330/278
See application file for complete search history.

(56) References Cited

U.S. PATENT DOCUMENTS

| | | | |
|---|---|---|---|
| 5,220,613 A | 6/1993 | Nishioka et al. | |
| 5,262,733 A | 11/1993 | Nakajima et al. | |
| 5,307,025 A | 4/1994 | Colvin et al. | |
| 5,682,121 A * | 10/1997 | Naokawa et al. | 330/252 |
| 5,805,020 A | 9/1998 | Danz et al. | |
| 5,887,177 A | 3/1999 | Heyl | |

(Continued)

FOREIGN PATENT DOCUMENTS

GB 2 022 949 12/1979

(Continued)

OTHER PUBLICATIONS

European Search Report, Jan. 25, 2008.

(Continued)

*Primary Examiner* — Vivian Chin
*Assistant Examiner* — Paul Kim
(74) *Attorney, Agent, or Firm* — Dickstein Shapiro LLP

(57) ABSTRACT

An amplifier circuit (100) has an input stage (OP1) and an output stage (Q1, Q2) operating with different supply voltages and different quiescent voltages. The output stage has a feedback input connected to receive a feedback signal from the output of the output stage. A biasing circuit (602) applies a bias signal (Ioff) to said input stage at an operating level appropriate to establish a quiescent output voltage different from a ground reference level of the input stage. To start up the amplifier with minimal transients at the output, the following steps are performed in sequence: (a) with the output stage disabled, pre-charging the amplifier output over a period of time to a level (Vmid) corresponding to the ground reference level of the input stage; (b) with the biasing circuit effectively disabled and a zero input signal at said signal input, enabling the input and output stages; (c) activating said biasing circuit progressively so as to ramp said bias signal (Ioff) to said operating level over a further period of time, thereby driving the output progressively to said quiescent output voltage. A separate improvement is in the biasing circuit, which uses the actual output stage supply voltage (PVdd) as a reference to define the operating level of said bias signal (Ioff).

48 Claims, 5 Drawing Sheets

U.S. PATENT DOCUMENTS

| | | |
|---|---|---|
| 6,281,821 B1 | 8/2001 | Rhode et al. |
| 6,384,678 B2 | 5/2002 | Berkhout |
| 6,448,851 B1 | 9/2002 | McIntosh et al. |
| 6,489,840 B2 | 12/2002 | Botti et al. |
| 6,492,928 B1 | 12/2002 | Rhode et al. |
| 6,522,278 B1 | 2/2003 | Rhode et al. |
| 6,720,825 B2 | 4/2004 | Hansen et al. |
| 2003/0058040 A1 | 3/2003 | Miyagaki et al. |
| 2003/0223601 A1 | 12/2003 | Kato et al. |
| 2004/0204162 A1 | 10/2004 | Mendoza et al. |
| 2004/0217808 A1 | 11/2004 | Kim et al. |

FOREIGN PATENT DOCUMENTS

| | | |
|---|---|---|
| GB | 2 388 483 | 11/2003 |
| JP | 2001-223536 | 8/2001 |
| WO | WO 98/45938 | 10/1998 |
| WO | WO 2005/081400 A1 | 9/2005 |

OTHER PUBLICATIONS

P. Morrow et al., "A 20-W Stereo Class-D Audio Output Power Stage in 0.6-μm BCDMOS Technology", *IEEE Journal of Solid-State Circuits*, vol. 39, No. 11, pp. 1948-1958, Nov. 2004.

Application Note for WAN 0148, "Minimising 'Pops' and 'Clicks' with the WM8759", Wolfson Microelectronics (Mar. 2004).

Datasheet for WM8960, "Stereo CODEC with 1W Stereo Class D Speaker Drivers and Headphone Drivers for Portable Audio Applications", Wolfson Microelectronics (Sep. 2006).

Product Flyer for WM 8960, "Stereo CODEC with 1W Stereo Class D Speaker Driver", Wolfson Microelectronics (Feb. 2006).

* cited by examiner

AMPLIFIER CIRCUITS, METHODS OF STARTING AND STOPPING AMPLIFIER CIRCUITS

FIELD OF THE INVENTION

The invention relates to amplifier circuits, particularly circuits having separate voltage supplies for different stages, or for some other reason having different ground reference levels for different stages. The invention also relates to methods and arrangements for controlling the start-up of such amplifiers while minimizing transients, and to audio and electromechanical apparatus including such amplifiers and methods.

BACKGROUND

It is a general requirement of audio circuits that that no audible 'pops' or 'clicks' occur through the loudspeaker or headphone when the circuit is powered up or powered down. Pops occurring during start-up or shutdown are generally caused by transient voltages across the load. Careful circuit design can avoid many start-up transients, for example by pre-charging capacitors to proper voltages. In Class D (PWM) amplifiers, the pulse train also can be modified at start up by a number of known techniques.

Even with such measures, a problem remains, however, particularly if there is a DC offset at the amplifier output during normal operation. When the amplifier turns on, the output voltage goes from zero volts to the steady-state offset voltage in a relatively short time period, resulting in a pop.

In a full-bridge type amplifier, or one with split rail (positive and negative) voltage supplies, there may be nominally no DC component at the output, but in reality some DC offset will always be present. To achieve low DC offset voltages, accurately matched components and circuits are required, which tends to increase their size, resulting in higher silicon area and associated cost. For this reason, an economic implementation of such an amplifier will always have some measurable offset, and thus possibly generate a pop on start-up.

The known measures also do not address a further source of transients that has been identified by the inventor. This arises in amplifiers where the quiescent input and output voltages (ground reference levels) are different by design, for example where the input stage and output stage operate at different supply voltages. Such amplifiers will be referred to herein as 'dual-supply' amplifiers for convenience, although the principles of the invention apply to amplifiers with different ground reference voltages in input and output stages, even if the supplies to each stage are nominally the same.

Where the input and output stages are DC coupled, a bias current or voltage can be applied somewhere in the circuit to ensure that the output is biased half-way between the output rails (or at whatever voltage is defined as the ground reference level for the output signal) when the input signal is biased half-way between the input stage supply rails (or at other defined input ground reference level). Typically the output will be pre-charged to its nominal quiescent bias voltage in a gradual fashion before fully activating the output amplifier, for example by pre-charging an output a.c. coupling capacitor from large-value resistor divider to give a long time constant. But any difference between this pre-charge voltage and the output voltage from the output amplifier derived with the bias signal will result in an associated startup transient. To reduce such a difference to, say, one part in a thousand of the full-scale audio signal requires that both the pre-charge voltage and the bias signal are accurate to a similar precision to this, despite for example inevitable random manufacturing mismatches between components in circuitry deriving them, second-order circuit effects, and the effect of tolerances in supply voltages. As an alternative to DC coupling and setting the quiescent output level via a bias current injected at the input, AC coupling via capacitors and setting the quiescent output level by local d.c. feedback around the output stage is also possible, but may not be attractive in an integrated circuit implementation. Furthermore, a local d.c. feedback arrangement also has its own start-up and offset problems.

SUMMARY OF THE INVENTION

The invention has a first object to reduce or eliminate transients or 'pop' associated with the start-up of an amplifier circuit, while reducing the need for accurately matched components with their associated size and cost penalty. The invention in particular aims to correct errors in amplifiers having unequal ground reference levels for input and output stages. Start-up transients are a problem in applications other than audio applications, and so the invention is not limited to audio applications even though the examples to be described may be primarily audio examples.

The invention in a first aspect provides a method of starting an amplifier circuit having an input stage and an output stage, the output stage having an output for driving a load, the input stage having a signal input for receiving a signal to be amplified and a feedback input connected to receive a feedback signal via a feedback path from the output of the output stage, the amplifier further comprising a biasing circuit for applying a bias signal to said input stage at an operating level appropriate to establish a quiescent output voltage different from a ground reference level of the input stage, the method comprising the following steps in sequence:

(a) with the output stage disabled, pre-charging the amplifier output over a period of time to a level corresponding to the ground reference level of the input stage;

(b) with the biasing circuit effectively disabled and a zero input signal at said signal input, enabling the output stage;

(c) activating said biasing circuit progressively so as to ramp said bias signal to said operating level over a further period of time, thereby driving the output progressively to said quiescent output voltage.

The inventor has recognised that transients in dual-supply amplifiers are difficult to eliminate due to unpredictability of the actual output quiescent voltage due to manufacturing tolerances in components or due to second-order circuit effects, but this problem can be addressed by firstly smoothly pre-charging the output to a voltage corresponding to zero bias signal, and then gradually increasing the bias signal as a means of ramping the output gently to its final value, thus avoiding any voltage step between some independently derived pre-charge voltage and the actual steady-state quiescent output voltage. The invention does require active control of the bias signal, where prior designs may have used a simple resistor or constant current source, but this control is relatively simple to implement. It may also be combined with implementation of the second aspect of the invention, detailed below.

In step (a) the voltage corresponding to the ground reference level of the input stage may be defined by reference to an actual input stage supply voltage. Alternatively it may be an absolute voltage, defined for example by a bandgap reference circuit designed with regard to expected input stage supply voltages.

In this specification, the ground reference level for the input signal is the absolute voltage at which the input signal is considered to represent zero signal and is defined as the output ground reference level. In an embodiment where the input stage supply is balanced, the ground reference level will normally correspond to a circuit ground voltage. In an embodiment where the input stage supply is single-ended, the ground reference level will normally be a voltage approximately mid-way between the input stage supply rails, although it could be designed to be at some other voltage if other aspects of the design dictate.

Similarly, the ground reference level for the output stage is the absolute voltage at which the output signal is desired to be to correspond to zero input signal. In an embodiment where the output stage supply is balanced, the ground reference level will normally correspond to a circuit ground voltage. In an embodiment where the output stage supply is single-ended, the ground reference level will normally be a voltage approximately mid-way between the output stage supply rails, although it could be designed to be offset from the mid-way voltage if other aspects of the design dictate.

In step (c) the biasing circuit may refer to the actual output stage supply voltage as a reference to define the bias signal.

The difference in input and output ground reference levels may arise because the input stage operates at a different supply voltage to the output stage, and it is desirable for the signal to be centred approximately mid-way between the respective supply rails. This is the most common reason but the invention is applicable whatever the reason for the difference.

The nominal voltage of the input stage voltage supply will in most embodiments be lower than that of the output stage supply, and the embodiments to be described will follow that pattern. However, the techniques may equally be applied, with adaptation if necessary, in cases where the input stage supply voltage is nominally higher than the output stage supply voltage, or the nominal voltages of both supplies are the same.

The invention in either case exploits the dual supply arrangement to provide a novel two-stage start-up procedure in which the matching of components is less critical altogether.

The input stage may comprise a node at which the input signal and the feedback signal are summed. Said node may be connected to the inverting input of an operational amplifier. In an inverting amplifier configuration, said inverting input may form a virtual earth. In a non-inverting configuration, for example, the feedback input might not be coupled to a virtual earth, but the overall operation of the input stage would still comprise a summation of input and feedback signals. The term summation includes the possibility of subtraction. The feedback path may comprise a resistor.

The amplifier output may be coupled to the load via a DC-blocking capacitor, this capacitor primarily determining the amount of charging required in step (a). The charging in step (a) may be performed through a resistor, the resistance and DC-blocking capacitance primarily defining the duration of said first period of time. The term resistor in this context includes a switch having a suitable on-resistance, as well as a dedicated resistor.

The charging in step (a) may be performed via a first switch controlled in response to the output of a comparator comparing the voltage on the output with the input stage ground reference level. The input stage ground reference level used for this comparison may for example be derived from the input stage Supply rails via a potential divider. This input stage ground reference level will usually be required to bias other circuitry, possibly the non-inverting input of the input stage if inverting, and this voltage will probably be buffered for distribution to parts of the circuit where it is needed.

In an embodiment where the bias signal is derived by reference to the output stage supply voltage, the biasing circuit may include a low pass function having a time constant sufficiently long to prevent in-band variations (meaning variations at frequencies above the low-frequency cut-off of the AC-coupled amplifier response), in the output stage supply voltage being reproduced in said compensating current during normal operation of the amplifier. The duration of the second period of time in step (c) may be determined primarily by the time constant of said low-pass filter. Alternatively, the method may include modifying the time constant of said low-pass filter temporarily during step (c) so as to allow the bias signal to reach the defined voltage more quickly than the time constant of the low-pass filter would allow in normal operation.

The biasing circuit may comprise a current mirror having an input leg and at least one output leg, the input leg being operated with a voltage offset corresponding to the ground reference level of the input stage The biasing circuit may further include a potential divider connected between the output stage supply rails, a tap of said potential divider being coupled to the input leg of the current mirror via a resistance corresponding to a resistance of said feedback path between the amplifier output and the feedback input of the input stage.

The step (c) may include modifying the operation of the means for deriving the voltage reference in the biasing circuit. The means for deriving the voltage reference may include the low-pass function described above. This can be implemented for example by connecting a capacitance in parallel with one leg of the potential divider mentioned above.

These features represent one economic implementation of the biasing circuit and other modules within the amplifier, but other implementations are equally possible within the scope of the invention, each with its own benefits and disadvantages.

The method may further comprise a subsequent step of (d) stopping the amplifier by disabling the output stage and then discharging the output to a ground voltage, ready for a repeat of the start-up steps (a) to (c).

The step (d) may be performed via a second switch and a resistor coupled between the output and a ground supply rail.

The output stage may comprise a pair of output devices in a push-pull arrangement.

The disabling of the output stage during step (d) may be performed by placing both output devices in a high-impedance state (tri-state operation).

The output stage may operate in a mode in which the output devices operate as switches, for example in an audio amplifier operating in a Class D or PWM mode.

The output stage may operate in a linear mode, for example Class AB.

In a multi-channel embodiment (for example stereo or surround sound audio systems), plural input and output stages can be connected to receive their respective bias signals from a common biasing circuit. Where the bias signal is a current, this may be provided by providing the biasing circuit with plural current-mirrored outputs. Similarly, the plural input and output stages and the biasing circuit can be controlled in parallel by a common control circuit to implement the sequence of steps (a), (b) and (c).

The invention in the first aspect further provides an amplifier circuit having an input stage and an output stage, the output stage having an output for driving a load, the input stage having a signal input for receiving a signal to be amplified and a feedback input connected to receive a feedback signal via a feedback path from the output of the output stage, the amplifier further comprising a biasing circuit for applying a bias signal to said input stage at an operating level appropriate to establish a quiescent output voltage different from a ground reference level of the input stage, the amplifier yet further comprising start-up circuitry responsive to a start-up condition of the amplifier circuit, said start-up circuitry including:

means for pre-charging the amplifier output over a period of time to a voltage corresponding to a ground reference level of the input stage;

means for activating said biasing circuit progressively so as to ramp said bias signal to said operating level over a further period of time thereby to drive the output progressively to said quiescent output voltage.

The start-up circuitry may further comprise start-up control circuitry arranged to control the pre-charging means and compensation means in such a sequence as to implement a method according to the first aspect of the invention as set forth above. The start-up control circuitry may comprise a microcontroller suitably programmed and connected to the start-up circuitry, or it may comprise dedicated circuits or a combination of the two.

Other preferred and optional features of the amplifier circuit and start-up circuitry are defined in the dependent claims.

The invention in a second aspect provides an amplifier circuit having an input stage and an output stage, the output stage being connected between output stage supply rails and having an output for driving a load, the input stage being connected between input stage supply rails potentially operating at a different supply voltage than the output stage, the input stage having a signal input for receiving a signal to be amplified and a feedback input connected to receive a feedback signal via a feedback path from the output of the output stage, the input stage further comprising a biasing circuit for applying a bias signal to said input stage at an operating level appropriate to establish a quiescent output voltage different from a ground reference level of the input stage, the biasing circuit having reference inputs connected to said output stage supply rails and being responsive to the actual output stage supply voltage in defining said bias signal.

Preferred features of the compensation circuit in the second aspect are the same as those described in relation to the first aspect above.

In a multi-channel embodiment, plural input and output stages can be connected to receive respective bias signals from a common biasing circuit.

The invention in each aspect further provides audio reproduction apparatus and electromechanical apparatus using the amplifier circuits and methods of the invention as set forth above.

These and other aspects of the invention will be understood from a consideration of the description of detailed embodiments which follows.

BRIEF DESCRIPTION OF THE DRAWINGS

Embodiments of the invention will now be described, by way of example only, by reference to the accompanying drawings, in which.

DETAILED DESCRIPTION OF THE EMBODIMENTS

Background

Figure 1:
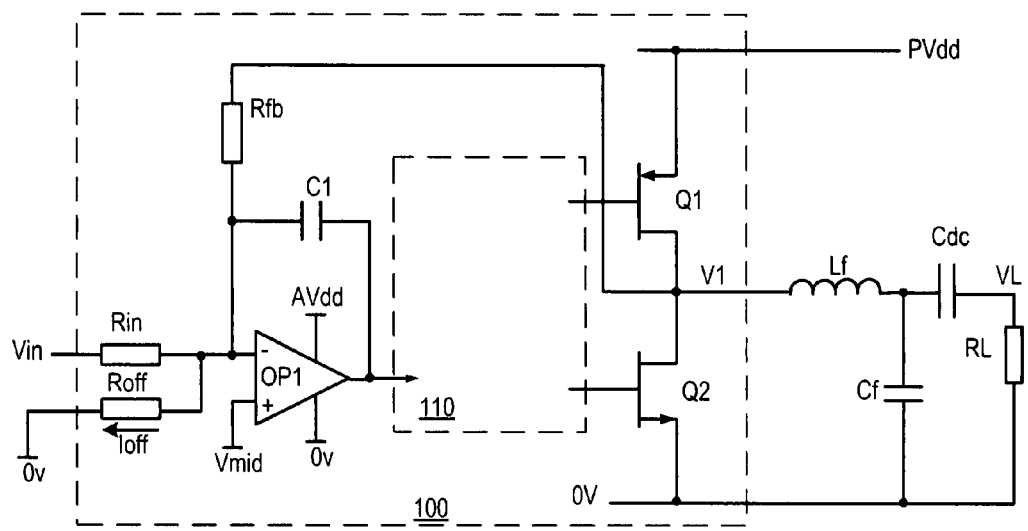
FIG. 1 shows in schematic form a known analogue-input pulse width modulator or Class D amplifier.

FIG. 1 shows a classical analogue-input pulse width modulator or class D amplifier 100. For the sake of example only, it is assumed that this amplifier is for driving a loudspeaker or earphones in an audio application. Other applications of amplifiers (particularly PWM amplifiers) include motor control and many others so that the invention is not at all limited to audio applications. The amplifier 100 has an input stage based around operational amplifier (op-amp) OP1. The amplifier also has a switching output (driver) stage formed by output switches (typically power transistors) Q1 and Q2 which switch a PWM output voltage V1 between power supply rails 0V and PVdd. An output filter Lf, Cf is provided to demodulate the audio signal by filtering off high frequency carrier components. In this example the supply is single-ended and a DC blocking capacitor Cdc is provided in series with the load RL, to pass only the wanted audio signal.

The input stage op-amp OP1 is configured as an integrating error amplifier with input resistor Rin and feedback resistor Rfb, effectively subtracting an attenuated version of the switched output signal V1 from the input signal Vin to derive an error signal at the inverting input of the op-amp. (The signals are shown being summed rather than subtracted in the diagram, but a net inversion occurs between the op-amp output and the switching output to give overall negative feedback, resulting in an overall amplifier that is inverting around the resulting virtual earth voltage. Summation is thus appropriate to cancel input and output signals.) The non-inverting input of the op-amp is connected to a mid-rail reference voltage Vmid, reflecting the fact that the switching output and the input voltage should each average to the mid-rail voltage to represent a zero value for the signal being amplified. A capacitor C1 sets the time constant of the integrator. The input stage thereby serves as part of a feedback loop via resistor Rfb, which serves in a known manner to provide attenuation of errors over the audio bandwidth that are introduced by the amplifier and power supply.

Between the input stage and the output stage in this feedback loop is a pre-driver stage 110 whose inner workings are not material to the present invention, it serves to process the output of OP1 to generate appropriate waveforms to drive the output devices Q1 and Q2. As this is a PWM or Class D amplifier circuit in the present example, and the input signal $V_{in}$ is an analogue (continuous time) signal, the pre-driver stage includes the conversion to a PWM signal format, by known techniques, for example by means of a triangle waveform generator and comparator.

The novel biasing and start-up techniques to be described can also be applied in cases where the input signal is PWM, and in cases where the amplifier circuit is not Class D but some linear amplifier such as Class AB, or other form: in these cases the pre-driver stage 110 will differ in inner working, but will operate within the feedback loop and serve to process the output of OP1 to generate appropriate waveforms to drive the output devices Q1 and Q2. Particularly in the case of a linear amplifier, OP1 may be a transconductance stage, and the capacitor C1 omitted, with another capacitor used to stabilize the loop, but the principles of operation for the purposes of the present invention will still be similar.

Dual Supply Issues—Background

In many applications the power supply for the output switching stage is isolated from that of the lower power circuitry which precedes it. In particular the input stage may be powered from a different voltage to the output stage. In the examples described herein, the output stage (switches Q1 and Q2 in FIG. 1) is powered from a supply at voltage PVdd (typically 12V), and the input stage is powered from a different supply at voltage AVdd (typically 3.3V) as shown in FIG. 1. The pre-driver stage 110 accordingly incorporates a level-shifting function to adapt signals in the range 0-AVdd to the range 0-PVdd appropriate to the output switching stage.

The input signal may swing from 0 to AVdd, centered on AVdd/2, and the output signal may swing from 0 to PVdd, centered on PVdd/2. In practice both signal swings will be reduced slightly from these values to allow for amplifier headroom and supply tolerancing. The ratio of these signal swings (approximately PVdd:AVdd) is compensated in the attenuation which feedback resistor Rfb provides in comparison with input resistor Rin.

The negative input (virtual earth) of OP1 sits at Vmid=AVdd/2. When the output stage is switching with a 50:50 duty cycle, the average voltage at the output of the output stage of the amplifier, that is the quiescent output voltage, is desired to be equal to a voltage PVdd/2 (this is the output stage ground reference level). The input voltage is at Vmid (the input stage ground reference level). By simple application of Ohm's law, it can be deduced that, at the desired operating conditions, an average current Ifb=(PVdd/2−Vmid)/Rfb will flow in the feedback path from the switched output into the virtual earth created at the inverting input of op-amp OP1. Both ends of resistor Rin will be at Vmid, so no current will flow through Rin. There is no d.c. path into OP1 or around its local feedback network. Accordingly, to achieve the desired operating conditions a compensating current Ioff is applied as a bias signal to sink this average feedback current and thereby ensure that the overall amplifier output V1 is biased around the ground reference level PVdd/2. For this reason, the known circuit includes a resistor Roff from the virtual earth to ground, as shown in FIG. 1. This will sink a current Ioff=Vmid/Roff, in which Roff is designed to give a current Ioff equal to the desired Ifb, by setting Roff=Rfb/(0.5*PVdd/Vmid−1).

Start-up Transients—Background

Figure 2:
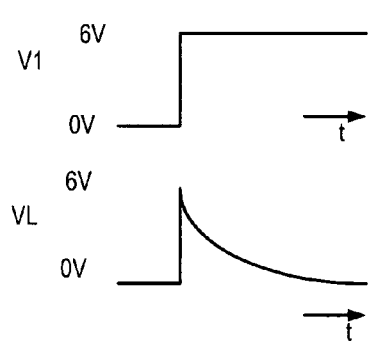
FIG. 2 illustrates one source of 'pop' which results from a sudden change in output voltage of the amplifier charging a DC blocking capacitor.

FIG. 2 illustrates the problem of 'pop' which occurs upon start up of many audio circuits. When the amplifier is inactive, output signal V1 is at zero volts as shown at the beginning of the trace, and the voltage VL on the load is likewise zero. However, when the amplifier becomes active, the average value of V1 rises suddenly to 6V, being half of the full supply voltage PVdd=12V. As shown in the lower trace, the load voltage VL returns to zero eventually, thanks to the action of the DC blocking capacitor Cdc, but initially there is a jump to 6V which produces an audible 'pop' in the load.

Figure 3:
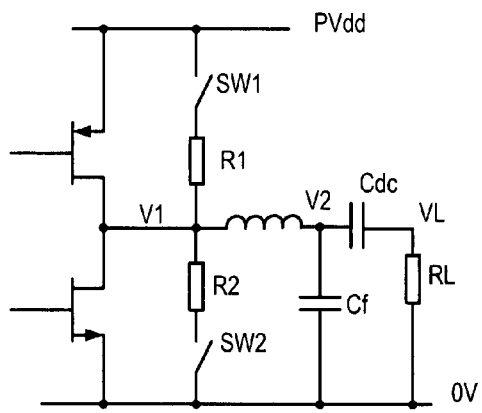
FIG. 3 illustrates a known form of modification to the output stage of the amplifier to reduce transients of the type illustrated in FIG. 2.

FIG. 3 illustrates one prior-art scheme to reduce the pop, based on two additional switches SW1 and SW2 and resistors R1 and R2 which form a potential divider when the switches are closed. This divider is connected between the supply rails and the output of the switching output stage. At power-up, the switches SW1 and SW2 are closed by a control circuit (not shown). Assuming resistors R1 and R2 are equal values, the voltage V1 will in the limit reach PVdd/2 as capacitors Cdc and Cf are pre-charged by the divider. When the class D output is enabled, if it switches with an exactly 50-50 duty cycle, the output would ideally go immediately to PVdd/2, resulting in no initial current through the load and no pop. Switches SW1 and SW2 can then be opened and normal operation resumed. This pre-charging technique is described in Paul Morrow, "A 20 W stereo Class-D Audio Output Power Stage in 0.6 um BCDMOS Technology", IEEE Journal SSC Vol 39 No 11, November 2004, FIG. 14.

Referring back to the known circuits of FIGS. 1 to 3, notwithstanding the use of known techniques such as pre-charging the output to reduce start-up 'pop' effects, transients are still found to arise from the fact that different ground reference levels (quiescent signal voltages) apply in the input and output stages. If the steady-state quiescent output voltage is not exactly equal to the voltage to which the output is initially charged, there will be a transient on power-up. This inequality can arise from the following conditions:

a) The supplies are not at their precise nominal voltages, on which the design of the circuit to generate the bias signal (Ioff) is based;

b) The components relied upon to set the bias signal are not exactly matched, meaning that the generated bias signal is not precisely correct and the output ends up not at PVdd/2, even if the supplies are at their ideal voltages; and/or c) The bypass capacitor is not charged to exactly PVdd/2, again due to resistor mismatches.

Novel Offset Compensation Circuit 402

It may be noted that in the known circuit of FIG. 1, the bias signal Ioff is defined by Vmid, so the quiescent voltage at the output of the amplifier is defined as a predefined fraction of AVdd. It does not track any variation or tolerance in PVdd. Therefore additional tolerances have to be allowed in the design for variation in the actual supply voltages from the nominal relationship. This in turn forces the designer to accept a lower output swing, for example, or apply tighter tolerances in the design of the power supplies.

Figure 4:
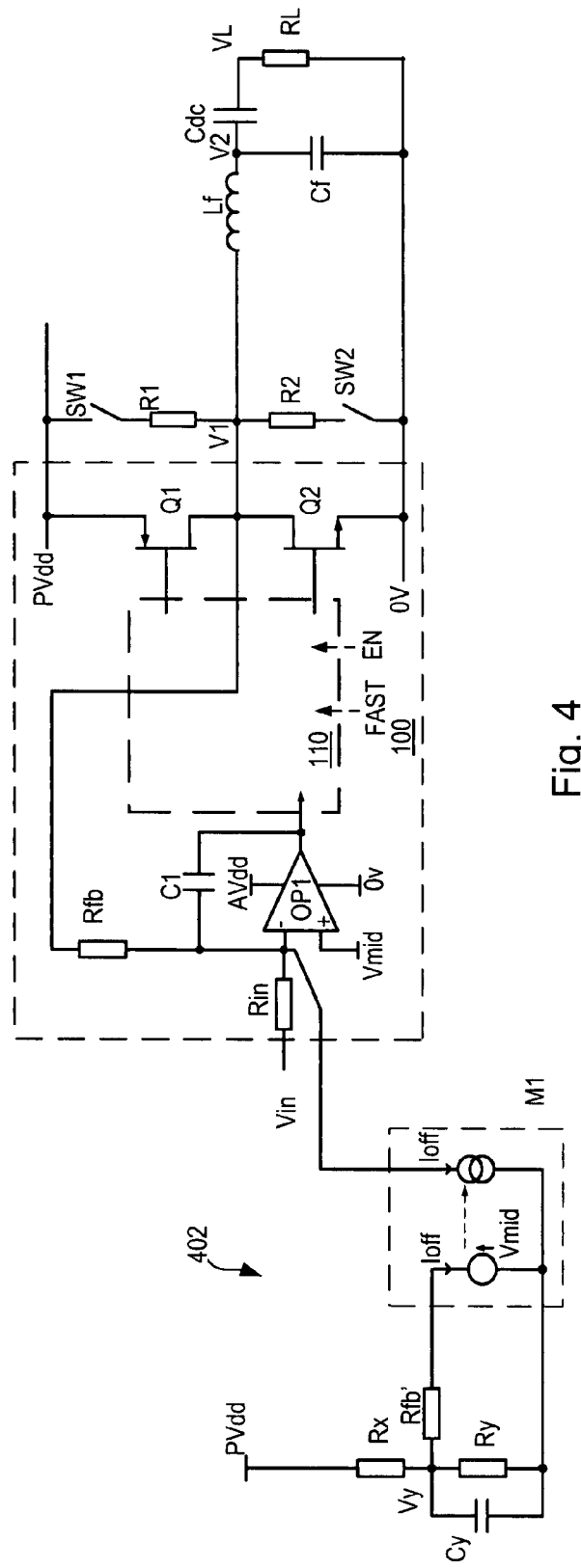
FIG. 4 shows in schematic form a first example of a novel dual-supply PWM amplifier circuit, embodying the second aspect of the invention as set forth above.

FIG. 4 shows an amplifier circuit including not only the pre-charging arrangement SW1/SW2 and R1/R2, but also a novel offset compensation circuit 402 connected to the input stage for compensation of the offset current mentioned above, replacing the resistor Roff The novel offset compensation circuit 402 comprises a voltage divider formed by two resistors Rx and Ry connected between PVdd, rather than AVdd), and ground. Resistor Rx is connected to PVdd. A capacitor Cy is connected in parallel with the lower resistor Ry. A resistor Rfb' couples the voltage Vy from the divider to the input branch of a current mirror M1. This current mirror uses the voltage reference Vmid, with the effect explained below.

The output branch of the current mirror is connected so as to sink an offset compensation current Ioff from the virtual earth of the amplifier input stage, where the known circuit had resistor Roff.

It should be understood that the reference voltage Vmid is chosen to be the middle voltage of the input stage supply, that is Vmid=AVdd/2, because that happens in this embodiment to be the ground reference level for the audio input signal Vin. A different ground reference level would imply a different reference voltage be used in the offset compensation and start-up procedures. The name Vmid therefore should not be taken to imply any limitation on the value of the reference voltage to the effect that it should always be AVdd/2.

The previous analysis shows that the offset current flowing through feedback resistor Rfb to the virtual earth of the op-amp OP1 can be compensated by an offset compensation current Ioff=(PVdd/2−Vmid)/Rfb being sunk from the virtual earth. In the known circuit of FIG. 1, this is achieved only approximately by the provision of a calculated resistance Roff between the feedback input and ground. In circuit 402, resistors Rx and Ry act as a voltage divider connected between PVdd and ground, designed to give an output voltage Vy equal to PVdd/2. The values of Rfb' and Rfb are matched and the current mirror M1 is designed to hold its input at Vmid, resulting in a voltage across Rfb' of Vy−Vmid. Thus the current flowing into the current mirror satisfies the formula above, even through variations in the voltage PVdd, and the offset current sunk by the current mirror from the virtual earth does also. (Note that due to the current drawn through Rfb', the condition Vy=PVdd/2 is achieved with Rx and Ry having non-equal values.) Capacitor Cy filters power supply-related components in the audio band which would otherwise couple directly into the input of the amplifier and degrade the power-supply rejection ratio (PSRR) of the amplifier.

Figure 5:
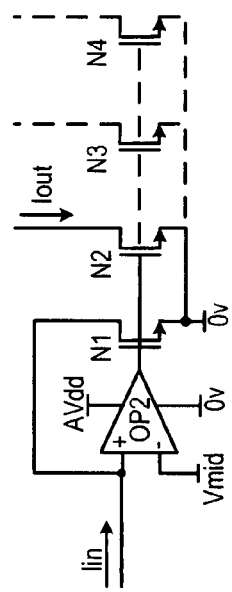
FIG. 5 shows in detail an offset current mirror circuit used in the circuit of FIG. 4.

FIG. 5 shows one possible implementation of such a current mirror M1 with input voltage held at reference voltage Vmid. In addition to two matched NMOS transistors N1 and N2, the circuit includes an operational amplifier OP2 connected as shown, with its non-inverting input connected to the reference voltage Vmid. In operation, the input current Iin is fed to the non-inverting input of the op-amp OP2, which by feedback drives transistor N1 to pass a current equal to the input current Iin. This non-inverting input is then a virtual earth with voltage forced equal Vmid. Transistor N2 is matched to transistor N1, and has the same gate and source voltage, so its drain current Iout is equal to the drain current of transistor N1, which is Iin. Thus Iout=Iin, and the input is held at Vmid. Variations on this known circuit will be well known to those skilled in the art, as will alternative circuits.

The effect of the novel offset compensation circuit is to provide an output quiescent voltage better aligned to the desired output ground reference level than the prior art described, despite non-ideal values of the supplies. The output ground reference level becomes independent of Vmid, so is insensitive to tolerancing or variation over time of AVdd. Assuming the output ground reference level is set to equalize signal headroom under nominal conditions (normally PVdd/2, but possibly some other voltage in the case of a non-symmetric output stage) this circuit will maximize the output signal swing under overload conditions: the signal will not start to clip until it extends over almost the full supply range rather than clipping prematurely on one rail. Under normal conditions the output will be better centered and so will suffer less distortion than a signal biased towards one rail. Also, on start up, if the output is precharged to a voltage dependent on PVdd as described in relation to FIG. 3, the discrepancy between this precharge voltage and the quiescent output voltage will no longer depend on PVdd, avoiding a cause of consistent pops on start-up.

Shown dotted in FIG. 5 are additional output legs comprising further matched transistors N3, N4. These provide identical or at least proportional bias currents, which can be used to bias additional amplifier circuits operating from the same supplies, as in FIGS. 8 and 9, described below. The biasing circuit in this way can be shared between several channels, reducing its cost impact.

Novel Start-up Sequence

Making the bias current Ioff directly dependent on PVdd has addressed the source (a) among the additional sources of transients identified as (a), (b) and (c) above. There remain sources (b) and (c), however, and the question remains whether these, too, need to be addressed before the amplitude of transients is reduced to an inaudible or at least acceptable level.

Using standard layout resistors available in CMOS processes, resistors are typically matched to around ±1% of each other. Without further modification, this offset would be applied across the load when the PWM output stage is enabled. To get an idea how this translates into transients, consider PVdd=12V and AVdd=3V. If R1 and R2 are mismatched by 1% (for example. R1 is high by ½% and R2 low by ½%), this will give a ½% error in PVdd/2, that is a 30 mV error. Similarly for Rx and Ry, giving a 30 mV error in Vy (assuming loading by Rfb' is small). Since Rfb and Rfb' nominally drop the same voltage (6V−1.65V=4.35V), this will give a 30 mV error contribution to the output. If the current mirror has 1% mismatch, this will give a 1% error in the 4.35V across Rfb, that is a 43.5 mV error in the output. Similarly, if Rfb and Rfb mismatch by 1%, this will give a 1% error in the voltage across Rfb, i.e. contribute 43.5 mV to the output error. Adding these worst case errors gives a worst-case residual offset of 30+30+43.5+43.5 mV=147 mV. Even assuming these are uncorrelated, so we can add them r.m.s. (root mean square), this gives a r.m.s. worst case error of 75 mV.

Listening tests suggest that offsets higher than 25 mV will produce an audible click or pop, so a transient between 75 mV and 147 mV is undesirable. The obvious solution to this would be to reduce the tolerances of the components to achieve more precise matching. Unfortunately, in order to achieve matching in the order of 0.1%, resistors become at least an order of magnitude larger in physical size and begin to occupy significant silicon area. An alternative solution to avoid pops arising from this residual offset is presented in the circuit of FIGS. 6 and 7.

Figure 6:
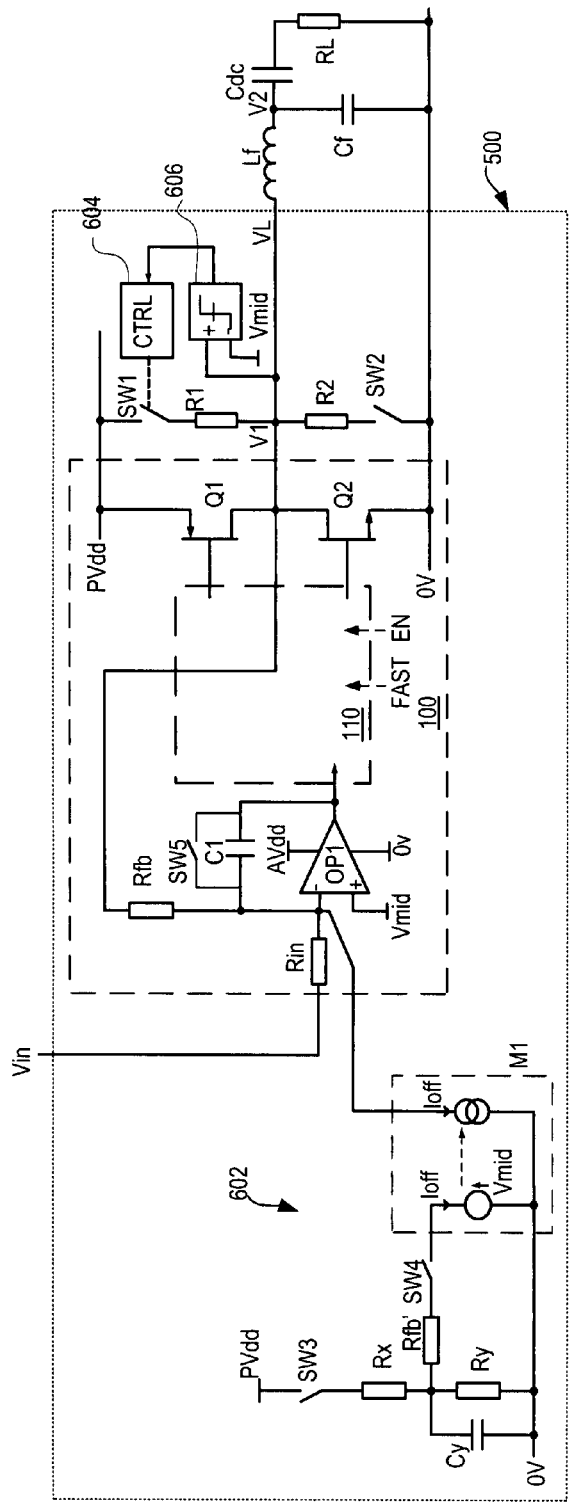
FIG. 6 shows in schematic form a second example of a novel dual-supply PWM amplifier circuit, embodying the first and second aspects of the invention as set forth above.
Figure 7:
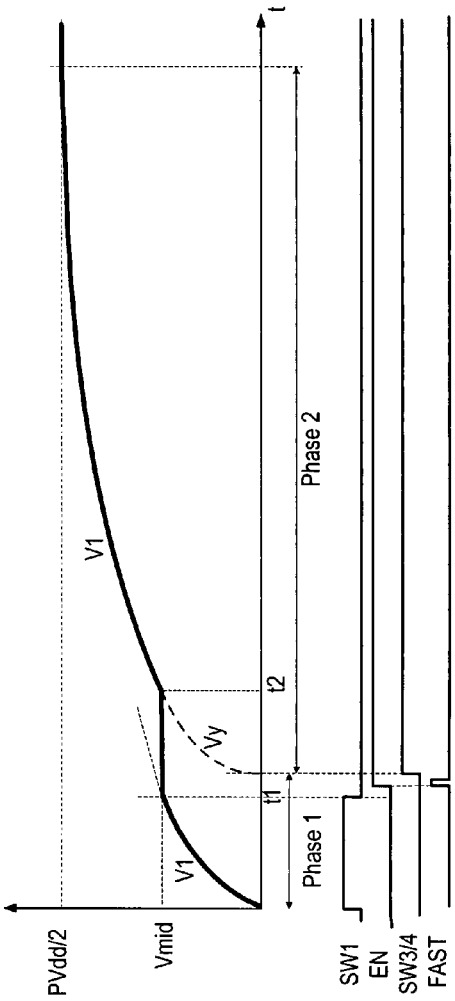
FIG. 7 is a waveform diagram illustrating two distinct phases in the power-up sequence of the novel amplifier, implementing the first aspect of the invention.

FIGS. 6 and 7 show the structure and operating sequences of a further novel amplifier circuit which mitigates transients arising from the residual uncertainty in offset bias current arising in dual-supply implementations. The main elements 100, 110 are unchanged, although the behavior of switch driver 110 at start-up is modified. In terms of its structure, the FIG. 6 circuit differs from FIG. 4 in the provision of a modified control circuit 604 and comparator 606 for the pre-charging switches SW1, SW2 associated with the output stage. Offset compensation circuit 602 is similar to 402 but incorporates a switch SW3 in series with Rx and a switch SW4 in series with Rfb'. the Switches SW1, SW2, SW3, and SW4 are controlled to implement a particular sequence and reduce the amplitude of output transients upon start-up. Note also the presence of switch SW5 to bypass and discharge the feedback capacitor C1 in the input stage.

The control circuit 604 also generates control signals EN and FAST to control the operation of the PWM amplifier 100 and driver 110 in particular, although these outputs are not shown on FIG. 6 to avoid clutter. Numerous other control signals and components associated with initialization of the circuit may ordinarily be provided around the main functional components illustrated here and may be generated by this control circuit. This control circuit 604 may be a separate circuit block, or some or all of it may be embedded in a general digital portion of an integrated circuit embodiment.

As shown in the graph of FIG. 7, the novel amplifier implements at least two distinct phases in the power-Lip sequence, by controlling the switches SW1 to SW4 in sequence, such that the residual offset is smoothed and the audible start-up transients are greatly suppressed. The operation of the circuit in these different phases will now be described.

Phase 1

Initially the output stage of the amplifier is disabled (signal 'EN' is low), including for example the op-amp OP1 and the output devices Q1, Q2. Switch SW2 is open but has been closed previously, so that the switching output V1 is at zero. Initially switches SW3 and SW4 are open, effectively disabling the offset compensation circuit 602 meaning that the bias signal to compensate the offset current will be zero. Switch SW5 is also closed to bypass and discharge the integrating capacitor C1.

When start-up is desired, switch SW1 is closed and the output V1 ramps up at a rate determined by the dominant RC time constant formed by R1 and Cdc. At time t1, comparator 606 detects that the output voltage V1 exceeds the reference voltage Vmid, so control circuit 604 opens switch SW1. Op-amp OP1 is then enabled. It should be recalled that Vmid is the ground reference level for the input stage and so, assuming the audio input signal is muted on start-up, Vin=V1=Vmid. Therefore, so long as the output devices Q1, Q2 remain disabled (high-impedance) and bypass switch SW5 remains closed, op-amp OP1 acts simply as a buffer, keeping its virtual earth at Vmid, so the output of the overall amplifier will remain substantially at a voltage of Vmid.

(Any leakage current from output nodes associated with V1 or V2 will cause ohmic drops across Rfb, but will be decoupled by the large capacitor Cdc so will have little effect during the timeframe of the start-up sequence. The op-amp offset will typically only be a few millivolts, so again is only a minor effect, even when scaled up by the offset voltage gain due to the ratio of Rfb and Rin.)

Next, after a short delay to allow the op-amp and other elements of circuit 100 to settle, signal 'EN' goes high and the output devices Q1, Q2 are enabled. The switch SW5 is opened also at this time, enabling the integrator portion of OP1. Since this embodiment is a Class D amplifier, part of the function of driver circuit 100 is pulse width modulation, and a high-bandwidth feedback loop through Rfb ensures the appropriate duty cycle to keep V1 averaging the same as the inputs summed by the op-amp OP1. In accordance with the signal voltage Vin=Vmid at this point in the start-up sequence, the PWM duty cycle will not be 50%, representing an output voltage of PVdd/2, but rather some other percentage appropriate to represent Vmid on a scale of 0 to PVdd. For example, if PVdd=12 volts and AVdd=3.3 volts, a duty cycle of 13.75% will apply (3.3/2=1.65V and 1.65/12.0=0.1375).

After this has happened, the first phase of the novel start-up sequence is complete, as seen where the output voltage V1 reaches an intermediate plateau in the trace of FIG. 7.

Phase 2

To begin the second phase of start-up, switches SW3 and SW4 are closed and the voltage Vy in the offset circuit 602 increases to PVdd/2 due to the RC time constant. Note that the current mirror output is actually only capable of sinking current. Initially Vy starts at 0V, while the current mirror input has a reference voltage of Vmid, so Ioff will be zero until Vy>Vmid. This is shown in FIG. 7 as the period between t1 and t2, with Vy represented (schematically and not to scale) in broken line. Once Vy surpasses Vmid, the offset current then increases, resulting in an increase in the DC voltage of the PWM output signal V1 too. The signal will continue increasing until it reaches PVdd/2.

Since Vy will take some time to reach Vmid, it may be desirable to shorten the overall start-up time by closing SW3 and SW4 at an earlier time, say at the same time as opening SW1.

In conclusion, it will be seen that the novel offset compensation circuit and start-up sequence have together eliminated several of the transients associated with conventional dual-supply designs. There is no sudden transition in output voltage between some pre-charge voltage and the quiescent output voltage, which even if nominally the same would in practice differ because of mismatches of components in manufacture. The ramping of the offset current, which is enabled with SW3, masks any mismatch in current sources or resistors. The quiescent output voltage may still differ from the ideal output ground reference level due to manufacturing mismatches of components, or even from second-order circuit effects, but such errors no longer give any audible effect: they will merely cause the output signal to be slightly off-centre.

Separately, the fact that the offset current (bias signal) is generated by reference to the actual output stage supply voltage removes a major cause of non-optimum centering of the output signal. The output ground reference level becomes independent of Vmid, so is insensitive to tolerancing or variation over time of AVdd. Assuming the ground reference is set to equalize signal headroom under nominal conditions (normally PVdd/2, but possibly some other voltage in the case of a non-symmetric output stage) this circuit will maximize the output signal swing under overload conditions.

Note that the resistors R1 and R2 no longer function as a potential divider, in that SW1 and SW2 are never both closed at the same time. The pre-charge and discharge resistors R1, R2 need no longer be well-matched, so may be laid out narrower and thus physically smaller than the previous circuitry. Indeed, they may even be integrated with their respective switches SW1, SW2 simply by using small transistors as switches with a relatively high on-resistance.

PWM Start-up Sequence

As is known for switching amplifiers such as the PWM example here, there may be some transient as the feedback loop comprising Q1 and Q2 is enabled and settles out. It should be noted that transients from these causes will tend to be narrower than those from other causes discussed above, and so their contribution to audible pops is much reduced, even if their amplitude is similar. These sources can be reduced by appropriate design, and the techniques known for this purpose should ideally be included in the novel circuit, if it is important to minimize transients. In one known approach, the PWM amplifier is initially clocked at a higher speed, typically 4 times the normal operating frequency for a few milliseconds. This reduces the duration of the first few pulses and reduces the associated energy in the audio band; hence the audible pop is reduced. Referring to FIG. 6, the controller can generate a 'FAST' control signal as shown, to enable the faster clocking during an initial period. Some PWM amplifiers, for example some hysteretic converters, will not have a clock supplied, in which case signal FAST may enable a temporary change in internal time constant or reduction in hysteresis or some other circuit parameter to temporarily increase the output stage switching rate. Other known techniques include optimizing the timing of the enabling of the loop relative to the PWM clock. Both of these techniques can be combined to have a fast clock and an optimally timed first pulse.

Power Down

During power-down, the audio signal is first muted. This may be done, for example, using a programmable gain amplifier, which attenuates the signal in multiple steps before fully attenuating the signal, to eliminate clicks associated with the mute. If the amplifier input is connected to a DAC, the signal may be attenuated using a digital volume control. The PWM output is then disabled by turning off both output switches Q1 and Q2. Again care is needed to optimize the timing of the disable signal relative to the PWM clock to avoid introducing a transient in the output. Finally, switch SW2 is closed and the output V1 is ramped down passively with the RC time constant. This returns the amplifier to the condition from which the start up sequence can be executed when desired. Ramping down the offset current Ioff is not required.

Conclusion/Modifications

In the embodiment of FIG. 6, as explained with the graphs of FIG. 7, the various causes of transients identified in the introduction are addressed to eliminate or at least reduce the occurrence of audible pops or other problems in the start-up and stopping of an output amplifier. Transients resulting from the use of a dual-supply arrangement are compensated by circuits 602-606 which are operated in a two-phase start-up sequence as described.

Figure 8:
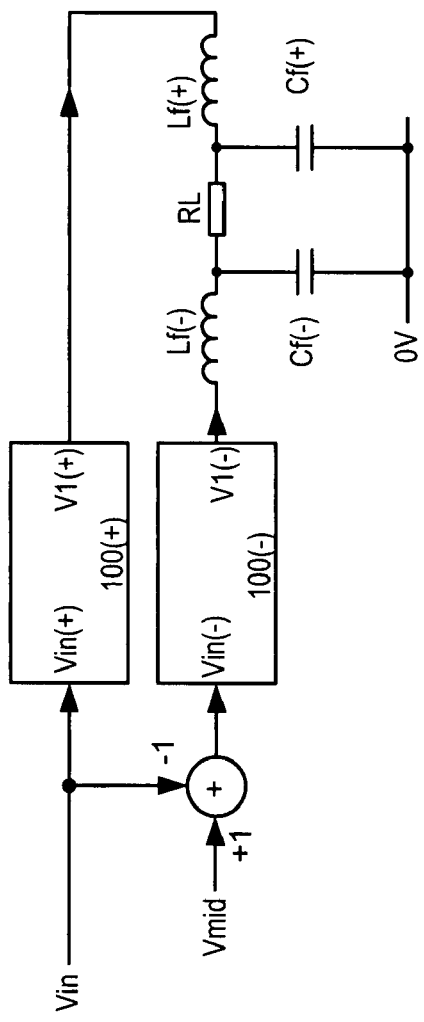
FIG. 8 is a block diagram showing two of the novel amplifier circuits connected in a bridge configuration.

FIG. 8 illustrates a "full-bridge" amplifier incorporating the above techniques. Amplifiers discussed so far provide a single output terminal to supply one terminal of a load whose other terminal is grounded. Such Class D or PWM amplifiers are termed "half-bridge" amplifiers. Other amplifiers, designated "full-bridge" amplifiers may comprise two identical amplifiers, here labeled 100(+) and 100(−) with the input to one amplifier applied in anti-phase to the other amplifier input, and the load RL tied between the two outputs, as shown in FIG. 8. In that case, no DC blocking capacitor is required, and it may be expected that the pop associated with this component (error source (c) in the analysis above) is removed. However there may still be filter capacitors Cf to ground which get pre-charged to the wrong voltage.

Also the supply voltage applied to both amplifiers will generally be the same, avoiding error source (a). However, the offsets associated with the component matching, such as the two Rfbs, are still relevant, (error source (b)), so that a sizeable switch-on pop may still occur. So it may be advantageous to use the inventive technique even in this class of amplifier. For example each amplifier in FIG. 8 could be implemented as an amplifier 100. When the amplifier is operating in bridge mode, using two identical class D amplifiers as described above, this technique will allow the output to settle gradually to any output offset voltage due to mismatches in the bias currents or resistors.

For a cost-effective implementation, much of the control circuitry and the offset compensation circuitry could be shared between the two amplifiers. FIG. 5 shows how a second output can be added to the current mirror M1 in an offset compensation circuit 602, the two outputs being connected to each amplifier 100(+) and 100(−) respectively. The controller can be modified if necessary to wait for the later of the two amplifier outputs to settle to Vmid before closing SW3 and SW4.

Figure 9:
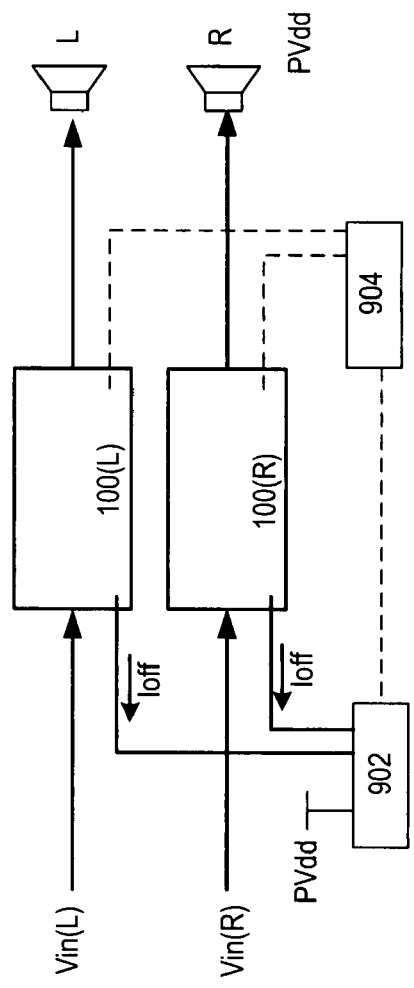
FIG. 9 is a block diagram showing two of the novel amplifier circuits connected in a multi-channel arrangement.

FIG. 9 illustrates this sharing for circuitry in the context of a multi-channel audio application. Again a pair of amplifier circuits 100 are provided, this time to drive a stereo pair of input signals and speakers, labeled (L) and (R) as appropriate. This diagram shows the shared biasing circuit 902 with current mirrored outputs going to the L and R input stages. Also shown is the shared control circuitry 904 with control lines going to the L and R output stages and to the biasing circuit 902. The skilled reader will appreciate that a stereo amplifier is just one example of a multi-channel amplifier, and that multi-channel amplifiers can include a bridged pair of amplifier circuits per channel, combining the FIGS. 8 and 9 arrangements. Multi-channel amplifiers are also not limited to audio applications, and the loads could as well be motors, transmission lines or antennas instead of speakers.

Figure 10:
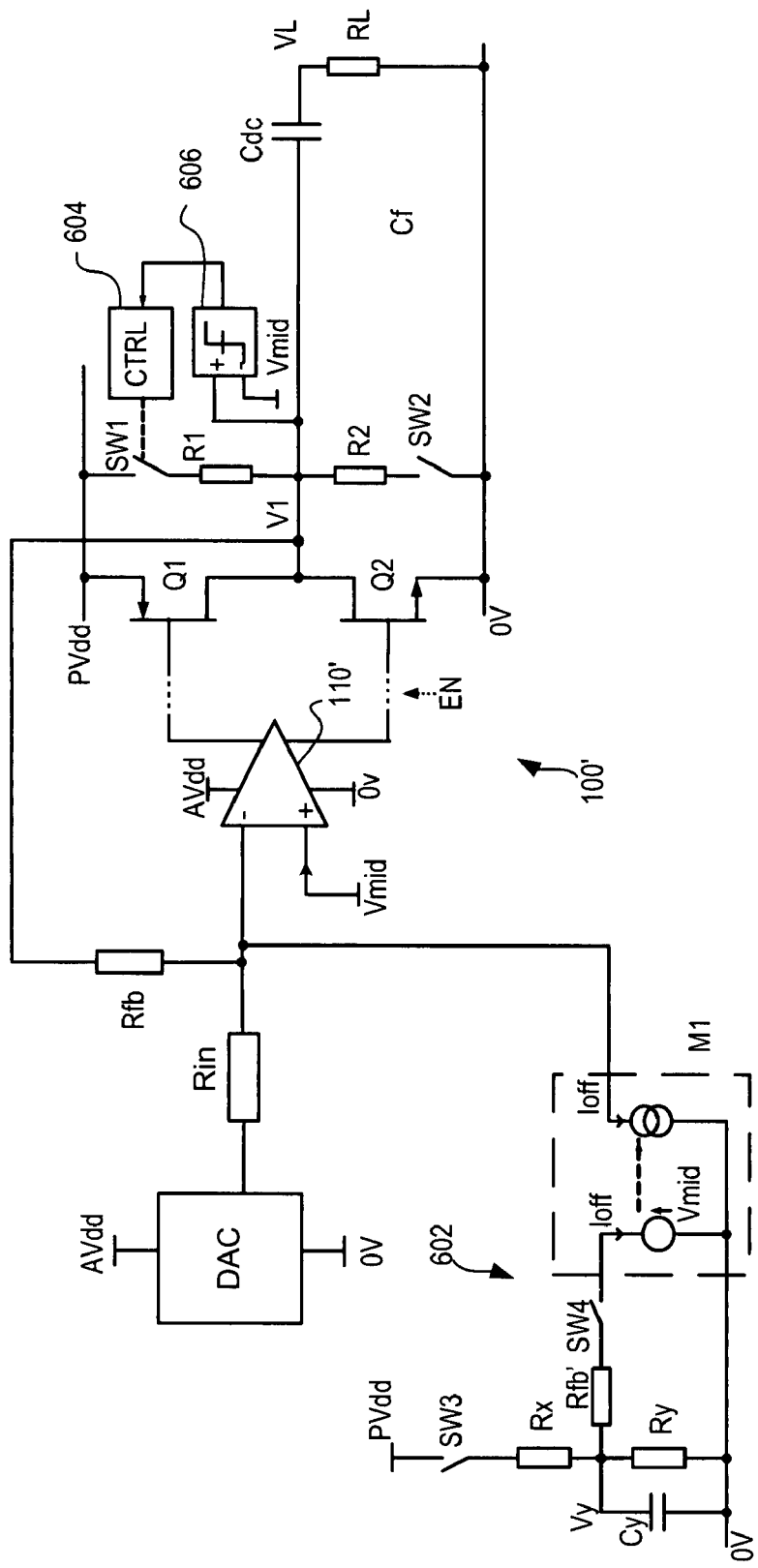
FIG. 10 shows in schematic form a dual supply linear amplifier circuit as a further embodiment of the first and second aspects of the invention.

FIG. 10 shows an alternative application of the circuits 602-606 in which a linear amplifier 100' replaces the Class D amplifier 100 of FIGS. 4 and 6. The linear amplifier has an input stage 110' which operates from a lower supply voltage AVdd than the output transistors Q1 and Q2 (PVdd). The circuits 602-606 operate in controlled phases around start-up and shutdown, to provide the same benefits as in the Class D amplifier of FIG. 6. Note that the output filter Lf/Cf is generally unnecessary in this case, so is not shown. As with the PWM example, there are known various principles and tricks of good design that should be deployed to minimize offsets and transients in a linear amplifier. The novel techniques disclosed herein are intended as a supplement to these techniques, rather than a substitute.

In both types of amplifier, a low frequency cut-off is required in the decoupling filter comprising Rx, Cy of the offset compensation circuit, to ensure that the offset current Ioff does not contain audio bandwidth signals, which would affect the ability of the circuit to provide power supply rejection. However this low-frequency cutoff competes with the requirement to start the circuit up quickly. In another variation, it is arranged to switch in lower values of Rx, Ry during the start-up phase. This effectively modifies the filter characteristic temporarily, to ensure fast ramping. These lower value resistors are then switched out during normal operation. Many alternative tricks can be applied to modify the filter response temporarily.

Various dual-supply arrangements are possible. If both supplies were split-rail and had a common ground, then the offset compensation would not be applicable and a source of transients eliminated. However, if just one supply is split rail, and offset current proportional to the difference in quiescent input and output voltages will still be required, and the general principle of ramping this offset bias current will still apply, albeit the circuit implementation may require to be adapted from that above. The bias signal may be generated in the form of a current, as illustrated, or a voltage might be appropriate in alternative implementation, perhaps either imposed on a resistor to an op-amp virtual earth or input terminal or even directly to an op-amp terminal.

Applications of the amplifier include audio applications, as mentioned already. In such cases the load RL will be a loudspeaker or headphones. The amplifier may be a stand-alone hi-fi component, or may be integrated with a signal source (radio receiver, CD or DVD deck, solid state memory (MP3 type players) in a static or portable housing. The loudspeaker may be integrated as well, for example in portable audio apparatus. Other applications include motor control, for example in industrial process control, electric vehicles or other electromechanical apparatus. While start-up transients in audio applications bring an annoying audible 'pop' to the listener, transients in electromechanical applications will bring a physical jolt to the apparatus which is just as important to minimise, if not more so. The amplifier may again be a stand-alone component or integrated in a vehicle or electromechanical actuator.

Use of the symbol RL for the load should not be taken to imply a purely resistive load. Most loudspeakers, motors and so on will have a significant inductive component to their impedance, for instance.

The skilled reader will appreciate that these and many other modifications and additions are possible to these circuits, without departing from the spirit and scope of the invention as defined in the appended claims.

What is claimed is:

1. A method of starting an amplifier circuit having an input stage and an output stage, the output stage having an output for driving a load, the input stage having a signal input for receiving a signal to be amplified and a feedback input connected to receive a feedback signal via a feedback path from the output of the output stage, the amplifier further comprising a biasing circuit for applying a bias signal to said feedback input at an appropriate level appropriate to establish a quiescent output voltage different from a ground reference level of the input stage, the method comprising the following steps in sequence:
   (a) with the output stage disabled, pre-charging the amplifier output over a period of time to a voltage corresponding to the ground reference level of the input stage;
   (b) with the biasing circuit effectively disabled and a zero input signal at said signal input, enabling the output stage;
   (c) activating said biasing circuit progressively so as to ramp said bias signal to said appropriate level over a further period of time, thereby driving the output progressively to said quiescent output voltage.

2. A method as claimed in claim 1 wherein, in step (a), the voltage corresponding to the ground reference level of the input stage may be defined by reference to an actual input stage supply voltage.

3. A method as claimed in claim 2 wherein the input stage supply voltage is single-ended, and the ground reference level is approximately a middle voltage between input stage supply rails.

4. A method as claimed in claim 1 wherein, in step (c), the biasing circuit refers to an actual output stage supply voltage as a reference to define the level of the bias signal.

5. A method as claimed in claim 1 wherein the input stage and output stage are connected to respective input stage and output stage supply rails and the nominal voltage between the input stage supply rails is lower than that between the output stage supply rails.

6. A method as claimed in claim 1 wherein the feedback input of the input stage comprises a node at which the input signal and the feedback signal are summed.

7. A method as claimed in claim 1 wherein the feedback path comprises a resistor.

8. A method as claimed in claim 1 wherein the amplifier output is be coupled to the load via a DC-blocking capacitor, this capacitor primarily determining the amount of charging required in step (a).

9. A method as claimed in claim 1 wherein the charging in step (a) is performed via a first switch controlled in response to the output of a comparator comparing the voltage on the output with a said input ground reference level.

10. A method as claimed in claim 1 wherein the biasing circuit includes a low pass filter having a time constant sufficiently long to prevent in-band variations in the output stage supply voltage being reproduced in a compensating current during normal operation of the amplifier.

11. A method as claimed in claim 10, the method including modifying the time constant of said low-pass filter temporarily during step (c) so as to allow the bias signal to reach the defined voltage more quickly than the time constant of the low-pass filter would allow in normal operation.

12. A method as claimed in claim 1 wherein the biasing circuit comprises a current mirror having an input leg and at least one output leg, the input leg being operated with a voltage offset corresponding to the ground reference level of the input stage.

13. A method as claimed in claim 12 wherein the biasing circuit further includes a potential divider connected between output stage supply rails, a tap of said potential divider being coupled to the input leg of the current mirror via a resistance corresponding to a resistance of said feedback path between the amplifier output and the feedback input of the input stage.

14. A method as claimed in claim 1 further comprising a subsequent step of (d) stopping the amplifier by disabling the output stage and then discharging the output to a ground voltage, ready for a repeat of the start-up steps (a) to (c).

15. A method as claimed in claim 14 wherein the step (d) is performed via a second switch and a resistor coupled between the output and a ground supply rail.

16. A method as claimed in claim 1 wherein the output stage comprises a pair of output devices in a push-pull arrangement.

17. A method as claimed in claim 16 wherein the disabling of the output stage during step (a) is performed by placing both output devices in a high-impedance state.

18. A method as claimed in claim 16 wherein the output stage operates in a mode in which the output devices operate as switches.

19. A method as claimed in claim 16 wherein the output stage operates in a linear mode.

20. A method as claimed in claim 1 wherein a plurality of amplifier circuits are started in parallel by the same sequence of steps.

21. A method as claimed in claim 20 wherein said plurality of amplifier circuits include two amplifiers connected to drive a single load in a bridge configuration.

22. A method as claimed in claim 20 wherein said plurality of amplifier circuits includes amplifier circuits for driving respective different loads.

23. A method as claimed in claim 20 wherein a common control circuit is provided to control the plurality of amplifier circuits to implement the sequence of steps (a), (b), (c) simultaneously.

24. A method as claimed in claim 20 wherein a common biasing circuit is provided to generate the bias signals for the plurality of amplifier circuits.

25. An amplifier circuit having an input stage and an output stage, the output stage having an output for driving a load, the input stage having a signal input for receiving a signal to be amplified and a feedback input connected to receive a feedback signal via a feedback path from the output of the output stage, the amplifier further comprising a biasing circuit for applying a bias signal to said input stage at an operating level appropriate to establish a quiescent output voltage different from a ground reference level of the input stage, the amplifier yet further comprising start-up circuitry responsive to a start-up condition of the amplifier circuit, said start-up circuitry including:
   means for pre-charging the amplifier output over a period of time to a voltage corresponding to a ground reference level of the input stage;
   means for activating said biasing circuit progressively so as to ramp said bias signal to said operating level over a further period of time thereby to drive the output progressively to said quiescent output voltage.

26. A circuit as claimed in claim 25 wherein the start-up circuitry further comprises start-up control circuitry arranged to control the pre-charging means and biasing circuit activating means in such a sequence as to implement a method as claimed in any of claim 1 to 24.

27. A circuit as claimed in claim 25 including a circuit for defining the voltage corresponding to the ground reference level of the input stage by reference to an actual input stage supply voltage.

28. A circuit as claimed in claim 27 adapted for use where the input stage supply voltage is single-ended, and including a circuit for defining the ground reference level of the input stage by dividing an input stage supply voltage.

29. A circuit as claimed in claim 25 wherein the biasing circuit is arranged to refer to an actual output stage supply voltage as a reference to define the level of the bias signal.

30. A circuit as claimed in claim 29 wherein the biasing circuit includes a low pass filter for preventing in-band variations in the output stage supply voltage being reproduced in bias signal during normal operation of the amplifier.

31. A circuit as claimed in claim 30 further comprising means for modifying the time constant of said low-pass filter temporarily during said progressive activation so as to allow the compensating current to reach the defined level more quickly than the time constant of the low-pass filter would allow in normal operation.

32. A circuit as claimed in claim 25 adapted for use where the nominal voltage of an input stage voltage supply is lower than that of an output stage voltage supply.

33. A circuit as claimed in claim 25 wherein the feedback input of the input stage comprises a node at which the input signal and the feedback signal will be summed.

34. A circuit as claimed in claim 25 wherein the feedback path comprises a resistor.

35. A circuit as claimed in claim 25 wherein the pre-charging means comprises a first switch controlled in response to the output of a comparator comparing the voltage on the output with said input stage ground reference level.

36. A circuit as claimed in claim 25 wherein the biasing circuit comprises a current mirror having an input branch and at least one output leg, the input leg being operable with a voltage offset corresponding to the ground reference level of the input stage.

37. A circuit as claimed in claim 36 wherein the biasing circuit further includes a potential divider connected between the output stage supply rails, a tap of said potential divider being coupled to the input leg of the current mirror via a resistance corresponding to a resistance of said feedback path between the amplifier output and the feedback input of the input stage.

38. A circuit as claimed in claim 25 further comprising means for stopping the amplifier by disabling the output stage and then discharging the output to a ground voltage.

39. A circuit as claimed in any claim 38 wherein said stopping means comprises a second switch and resistance coupled between the output and a ground supply rail.

40. A circuit as claimed in claim 25 wherein the output stage comprises a pair of output devices in a push-pull arrangement.

41. A circuit as claimed in claim 40 including means for placing both output devices in a high-impedance state during said pre-charging.

42. A circuit as claimed in claim 40 wherein the output stage is arranged to operate in a mode in which the output devices operate as switches.

43. A circuit as claimed in claim 40 wherein the output stage is arranged to operate in a linear mode.

44. An amplifying apparatus comprising plurality of amplifier circuits as claimed in claim 25.

45. An apparatus as claimed in claim 44 wherein said plurality of amplifier circuits include two amplifiers connected to drive a single load in a bridge configuration.

46. An apparatus as claimed in claim 44 wherein said plurality of amplifier circuits includes amplifier circuits for respective different loads.

47. An apparatus as claimed in claim 44 wherein a common control circuit is provided to control the start-up circuitry of the plural amplifier circuits in synchronism.

48. An apparatus as claimed in claim 44 wherein a common biasing circuit is provided to generate the bias signals for the plurality of amplifier circuits.

* * * * *